United States Patent

Lee et al.

(10) Patent No.: US 8,841,696 B2
(45) Date of Patent: Sep. 23, 2014

(54) HIGH-TRIGGER CURRENT SCR

(75) Inventors: Jam-Wem Lee, Zhubei (TW); Yi-Feng Chang, Xinbei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 13/459,283

(22) Filed: Apr. 30, 2012

(65) Prior Publication Data

US 2013/0285112 A1 Oct. 31, 2013

(51) Int. Cl.
*H01L 23/36* (2006.01)

(52) U.S. Cl.
USPC ........... 257/109; 257/107; 257/110; 257/112; 257/119; 257/E21.358; 257/E29.181; 438/133; 438/134

(58) Field of Classification Search
USPC ................. 257/107–182, 371, 918, E21.358, 257/E29.181; 438/133, 134
See application file for complete search history.

(56) References Cited

U.S. PATENT DOCUMENTS

| | | | |
|---|---|---|---|
| 5,856,214 A * | 1/1999 | Yu .................................. | 438/133 |
| 6,750,515 B2 * | 6/2004 | Ker et al. ...................... | 257/357 |
| 2011/0176244 A1 * | 7/2011 | Gendron et al. ................ | 361/56 |

OTHER PUBLICATIONS

Ker, M.D., "Lateral SCR Devices with Low-Voltage High-Current Triggering Characteristics for Output ESD Protection in Submicron CMOS Technology", IEEE Transactions on Electron Devices, Apr. 1998, 45(4):849-860.

* cited by examiner

*Primary Examiner* — Andy Huynh
(74) *Attorney, Agent, or Firm* — Duane Morris LLP

(57) ABSTRACT

An SCR includes a first doped region of a first type having a first doping concentration. A first well of the first type and a first well of a second type are disposed in upper areas of the first doped region of the first type such that the first well of the second type is laterally spaced from the first well of the first type by a non-zero distance. A second doped region of the first type has a second doping concentration that is greater than the first doping concentration and is disposed in the first well of the second type to form an anode of the SCR. A first doped region of the second type is disposed in the first well of the first type and forms a cathode of the SCR.

20 Claims, 8 Drawing Sheets

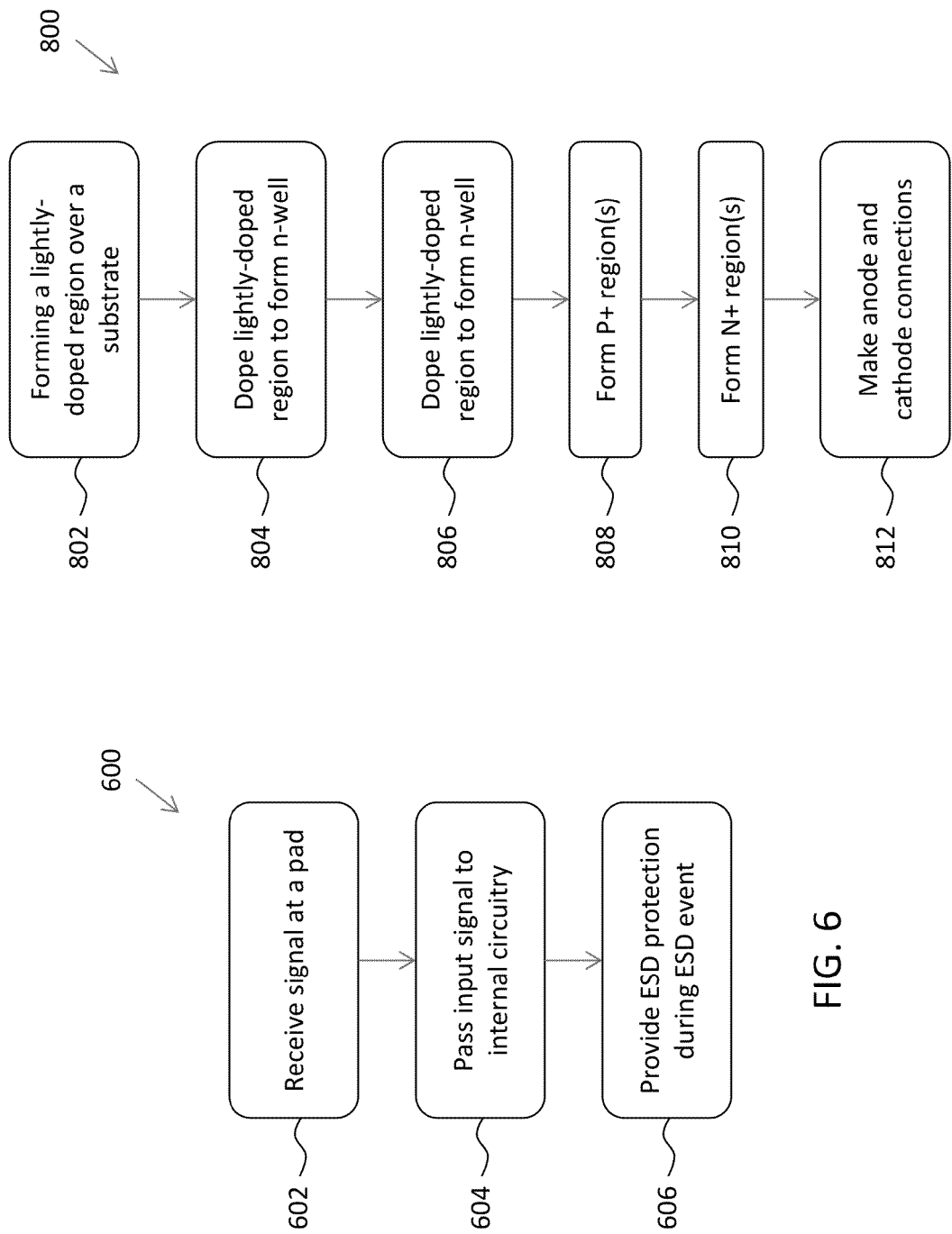

HIGH-TRIGGER CURRENT SCR

FIELD OF DISCLOSURE

The disclosed system and method relate to semiconductor devices. More particularly, the disclosed system and method relate to silicon-controlled rectifiers.

BACKGROUND

A silicon-controlled rectifier ("SCR") is a solid state device for controlling current. SCRs are typically used in electrostatic discharge ("ESD") circuits configured to protect sensitive internal circuitry from large voltage spikes. However, conventional SCR designs typically have low trigger current, which results in the SCR being inadvertently triggered and the internal devices they are supposed to protect being damaged.

BRIEF DESCRIPTION OF THE DRAWINGS

FIG. 6 is a flow diagram of one example of a method of providing ESD protection in accordance with some embodiments.

FIG. 8 is a flow diagram of one example of a method of fabricating a silicon-controlled rectifier in accordance with some embodiments.

DETAILED DESCRIPTION

This description of the exemplary embodiments is intended to be read in connection with the accompanying drawings, which are to be considered part of the entire written description.

The silicon-controlled rectifiers ("SCRs") described herein advantageously have higher trigger currents, which enables the SCRs to provide improved protections during electrostatic discharge ("ESD") events.

Figure 1:
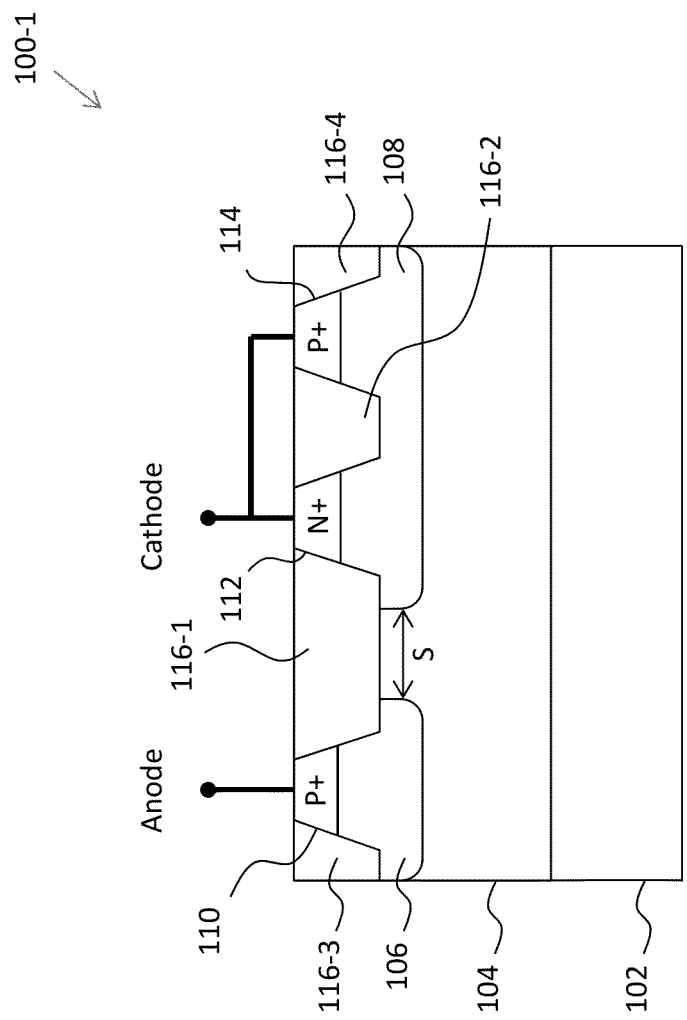
FIG. 1 is a cross-sectional view of one example of a silicon-controlled rectifier.

FIG. 1 illustrates one example of an SCR 100-1 formed over a semiconductor substrate 102. In some embodiments, semiconductor substrate 102 is a p-type semiconductor substrate. Substrate 102 can be formed from a variety of materials including, but not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

A lightly doped p-type region 104 is formed over semiconductor substrate 102. In some embodiments, lightly-doped region 104 is doped with p-type material in a concentration between $1 \times 10^{14}$ cm$^{-3}$ to $1 \times 10^{15}$ cm$^{-3}$. As will be understood by one of ordinary skill in the art, region 104 may be doped with any suitable p-type dopant such as, for example, boron, gallium, aluminum, or any Group III element. In some embodiments, lightly-doped region 104 is formed by epitaxial growth over substrate 102.

An n-well 106 and a p-well 108 are formed at an upper surface of lightly-doped region 104. N-well 106 and p-well 108 are separated from each other by a spacing distance, S. N-well is formed by doping a semiconductor material with a suitable n-type material such as, for example, arsenic, phosphorus, antimony, or other Group V element as will be understood by one of ordinary skill in the art. In some embodiments, n-well 106 is doped to a concentration between $1 \times 10^{16}$ cm$^{-3}$ to $1 \times 10^{17}$ cm$^{-3}$, and p-well 108 is doped to a concentration between $1 \times 10^{16}$ cm$^{-3}$ to $1 \times 10^{17}$ cm$^{-3}$.

A P+ region 110 is formed in the upper surface of n-well 106 and is configured to serve as the anode connection of SCR 100-1. P+ region 110 is formed by doping the area with a suitable p-type dopant to a concentration between $1 \times 10^{20}$ cm$^{-3}$ to $1 \times 10^{22}$ cm$^{-3}$.

An N+ region 112 and a P+ region 114 are formed in the upper area of p-well 108. N+ region 112 is separated from P+ region 110, which is formed in n-well 106, by a shallow trench isolation ("STI") region 116-1, and N+ region 112 is separated from P+ region 114 by STI region 116-2. One of ordinary skill in the art will understand that in some embodiments STI regions 116-1, 116-2, and 116-3 can be omitted. In some embodiments, N+ region 112 is doped by a suitable n-type dopant to a concentration between $1 \times 10^{20}$ cm$^{-3}$ to $1 \times 10^{22}$ cm$^{-3}$, and P+ region 114 is doped by a suitable p-type dopant to a concentration between $1 \times 10^{20}$ cm$^{-3}$ to $1 \times 10^{22}$ cm$^{-3}$. N+ region 112 and P+ region 114 are coupled together to form the cathode of SCR 100-1. In some embodiments, as will be understood by one of ordinary skill in the art, the coupling of the N+ and P+ regions 112, 114 is made in one of the metallization layers, e.g., M1, M2, etc., formed above N+ region 112 and P+ region 114 that coupled together metal contacts disposed directly on N+ and P+ region 114.

Figure 2:
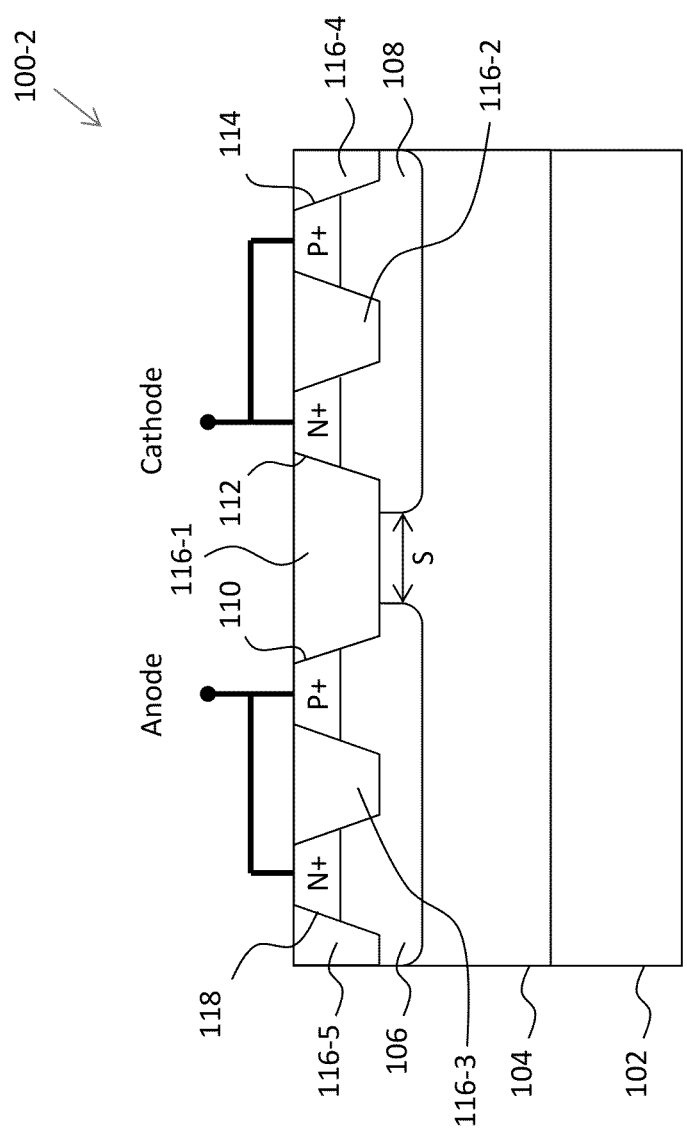
FIG. 2 is a cross-sectional view of another example of a silicon-controlled rectifier.

In some embodiments, such as the embodiment of an SCR 100-2 illustrated in FIG. 2, the anode includes both a P+ region 110 and an N+ region 118. The electrical connection between P+ region 110 and N+ region 118 is formed in a metallization layer, e.g., M1, M2, etc., disposed above P+ and N+ regions 110, 118. As shown in FIG. 2, N+ region 118 is formed in the upper area of n-well 106. N+ region 118 is separated from P+ region 110 by STI region 116-3. In some embodiments, N+ region 118 is doped using a suitable n-type dopant to a concentration between $1 \times 10^{20}$ cm$^{-3}$ to $1 \times 10^{22}$ cm$^{-3}$.

Figure 3:
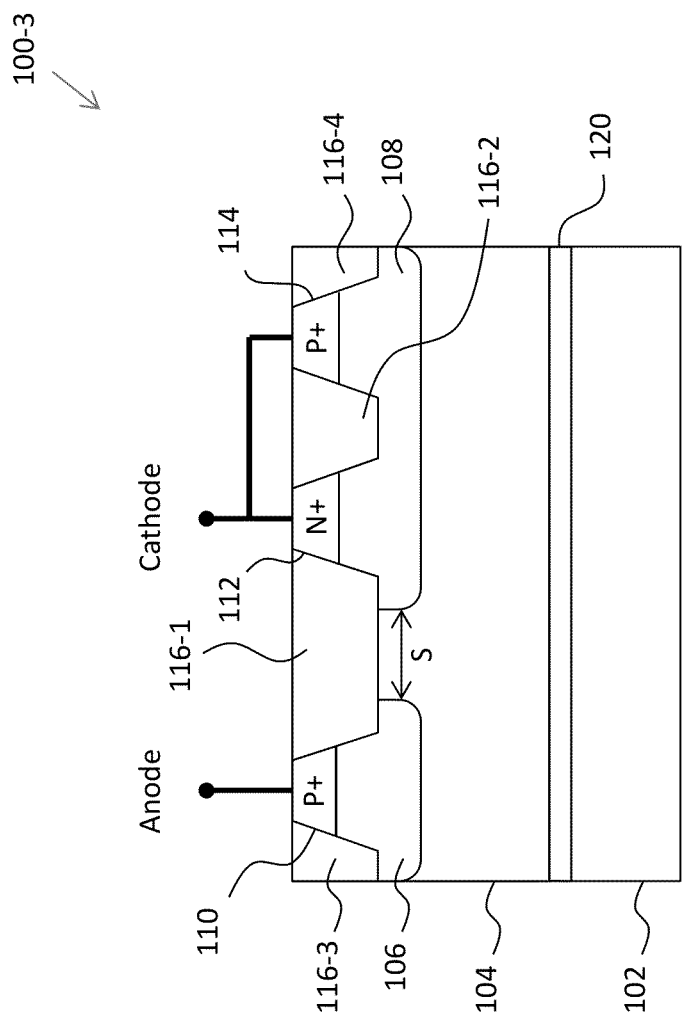
FIG. 3 is a cross-sectional view of another example of a silicon-controlled rectifier.

FIG. 3 illustrates another embodiment of an SCR 100-3. As shown in FIG. 3, an n-type buried layer ("NBL") is disposed between substrate 102 and lightly-doped region 104. NBL 120 acts as a barrier between semiconductor substrate 102 and the layers formed above NBL 120 including lightly-doped region 104, n-well 106, and p-well 108. As described above with respect to FIG. 1, a P+ region 110 is formed in the upper surface of n-well 106 and is configured to serve as the anode connection of SCR 100-3.

P-well 108 includes an N+ region 112 and a P+ region 114 formed in its upper area. N+ region 112 is separated from P+ region 110, which is formed in n-well 106, by a shallow trench isolation ("STI") region 116-1, and N+ region 112 is separated from P+ region 114 by STI region 116-2. N+ region 112 and P+ region 114 are coupled together to form the cathode of SCR 100-3. As described above, the electrical coupling between N+ region 112 and P+ region 114 to form the cathode of SCR 100-3 is disposed on one or more of the metallization layers, e.g., M1, M2, etc.

Figure 4:
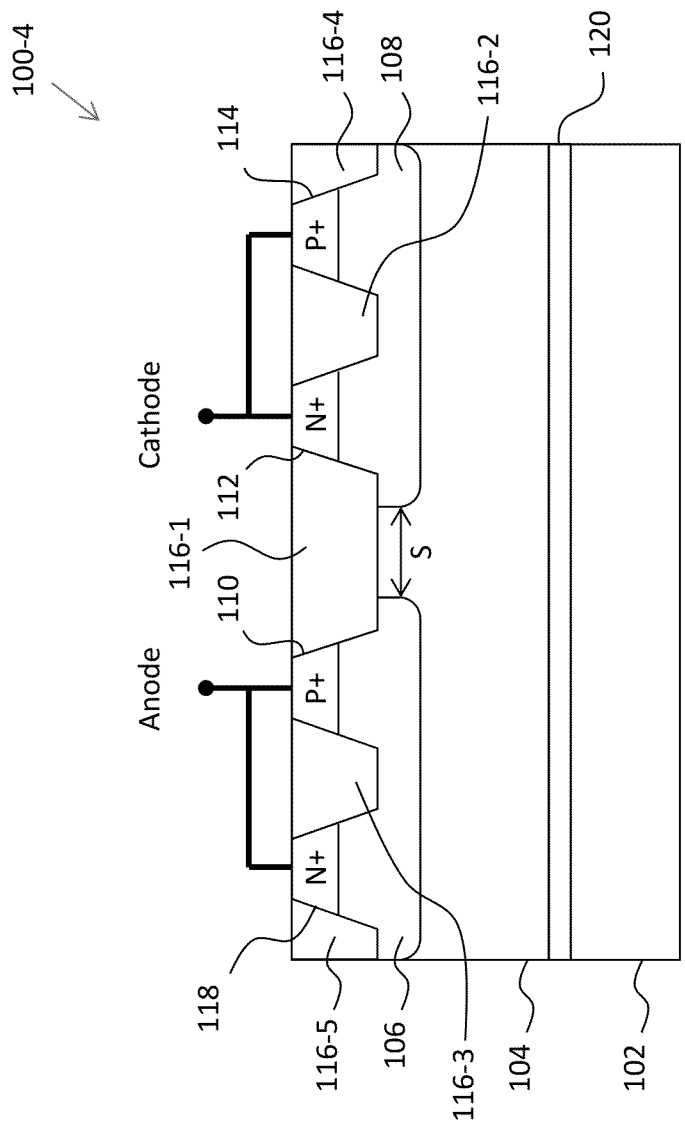
FIG. 4 is a cross-sectional view of another example of a silicon-controlled rectifier.

Another embodiment of an SCR 100-4 including an NBL 120 is illustrated in FIG. 4. As shown in FIG. 4, As shown in FIG. 4, an n-type buried layer ("NBL") is disposed between substrate 102 and lightly-doped region 104. NBL 120 acts as a barrier between semiconductor substrate 102 and the layers formed above NBL 120 including lightly-doped region 104, n-well 106, and p-well 108.

N-well 106 and p-well 108 are formed in an upper surface of lightly-doped region 104, which is formed above NBL 120. N-well 106 and p-well 108 are separated from each other by a spacing distance, S, which may be adjusted to tune the clamping characteristics of SCR 100-4. For example, increasing the spacing distance, S, results in SCR 100-4 having larger trigger and breakdown voltages while decreasing the spacing distance, S, lowers the trigger and breakdown voltages of SCR 100-4.

A cathode of SCR 100-4 is formed by connecting an N+ region 112 and a P+ region 114, which are formed in an upper surface of p-well 108. N+ region 112 is laterally spaced from P+ region 114. In some embodiments, the electrical coupling between N+ region 112 and P+ region 114 is disposed in an metallization layer, e.g., M1, M2, etc. An STI 116-2 is disposed between and separates N+ region 112 and P+ region 114. The anode of SCR 100-4 is formed by coupling together a P+ region 110 and an N+ region 118, which are formed in an upper surface of n-well 106. The electrical coupling forming the anode contact can be formed in a metallization layer disposed above P+ region 110 and N+ region 118, which are laterally spaced from one another and are separated by STI region 116-3. P+ region 110 formed in n-well 106 is separated from N+ region 112 formed in p-well 108 by STI region 116-1.

Figure 5A:
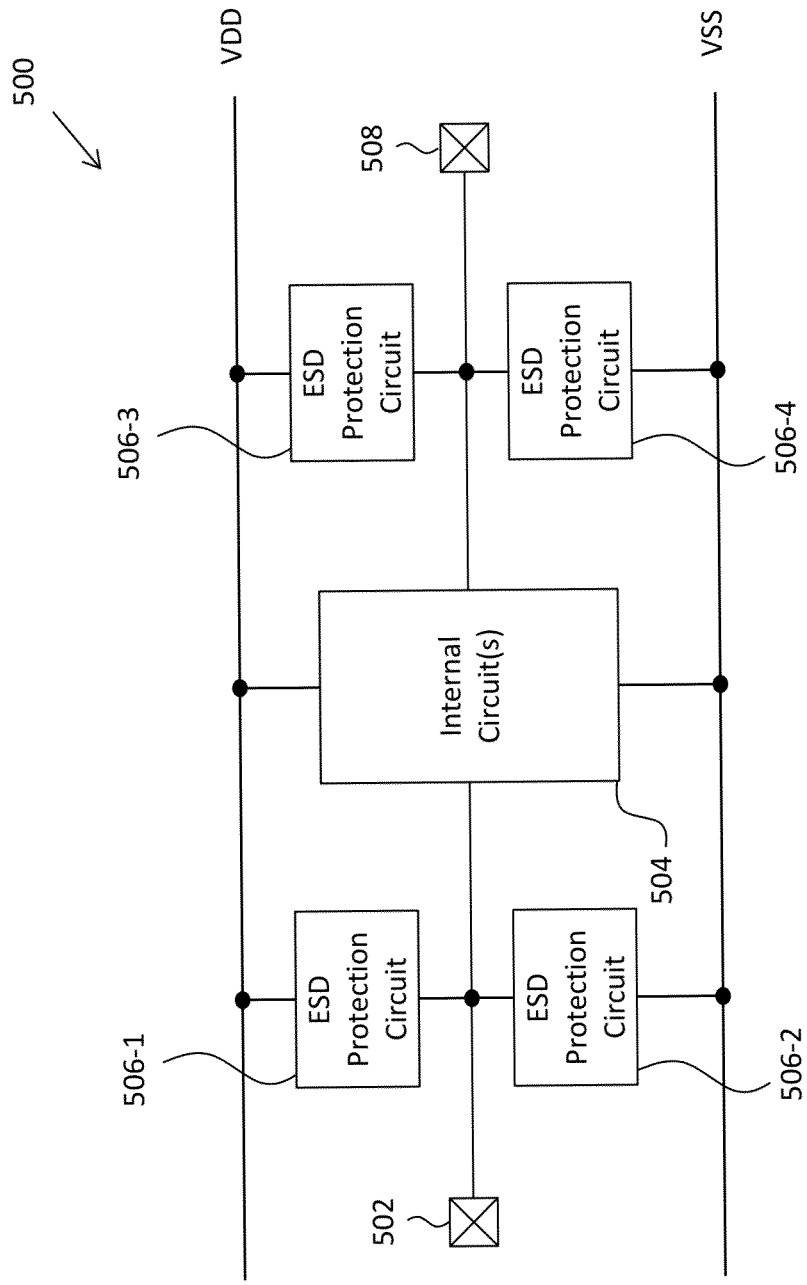
FIG. 5A is a high-level block diagram of an integrated circuit including ESD protection circuitry.
Figure 5B:
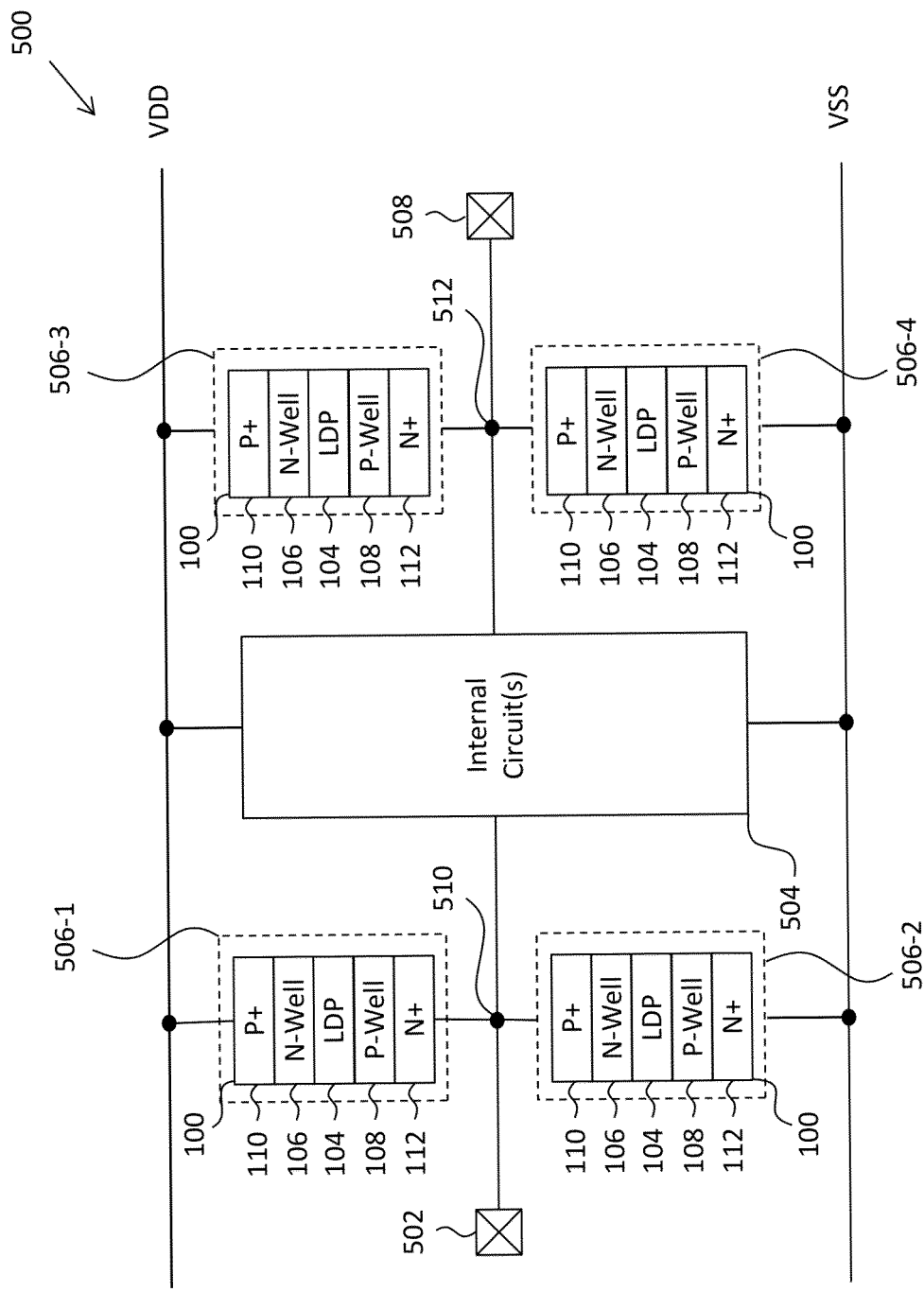
FIG. 5B is a more detailed block diagram of the integrated circuit illustrated in FIG. 5A.

In some embodiments, such as the embodiment illustrated in FIGS. 5A and 5B, the SCRs 100-1, 100-2, 100-3, 100-4 (collectively "SCRs 100") described above are used to as ESD protection devices. As shown in FIG. 5A, integrated circuit 500 includes an input pad 502 implemented in an integrated circuit 500 between an input node 502 that is coupled to internal circuitry 504 through ESD protection circuits 506-1, 506-2. ESD protection circuits 506-3 and 506-4 are also coupled between internal circuit(s) 504 and output pad 508.

The more detailed FIG. 5B illustrates how SCRs 100 are implemented as ESD protection devices 506-1, 506-2, 506-3, and 506-4. The SCRs 100 serving as ESD protection device 506-1, 506-3 have their respective anodes, which are coupled to their respective P+ regions 110, coupled to the high voltage supply VDD. The cathode of SCR 100 of ESD protection device 506-1, which is electrically coupled to N+ region 112, is coupled to input pad 502 and internal circuitry 504 at node 510. The cathode of SCR 100 of ESD protection device 506-3 is coupled to output pad 508 and to internal circuit(s) 504 at node 512.

The cathodes of SCRs 100 of ESD protection devices 506-2, 506-4, which are electrically coupled to N+ regions 112, are coupled to low voltage supply VSS. The anode of SCR 100 of ESD protection device 506-2 is coupled to node 510, and the anode of SCR 100 of ESD protection device 506-4 is coupled to node 512. The current discharge paths of SCRs 100 is formed through N+ region 112, p-well 108, lightly-doped p-type region 104 ("LDP"), n-well 106, and P+ region 110.

The operation of SCRs 100 is described with reference to FIGS. 5 and 6 in which FIG. 6 is a flow diagram of one example of a method 600 of providing ESD protection. At block 602, a signal is received at input pad 502 or output pad 508.

If the signal received at pad(s) 502, 508 is a normal input or output signal, i.e., a non-ESD event signal, SCRs 100 are off and the signal is pass from input pad 502 to internal circuit(s) 504 and/or from internal circuit(s) 504 to output pad 508 at block 604.

At block 606, SCRs 100 provide ESD protection during an ESD event. As will be understood by one of ordinary skill in the art, ESD protection diverts high currents that result from voltage spikes away from internal circuit(s) 504 to high voltage source VDD or to low voltage source VSS.

Figure 7A:
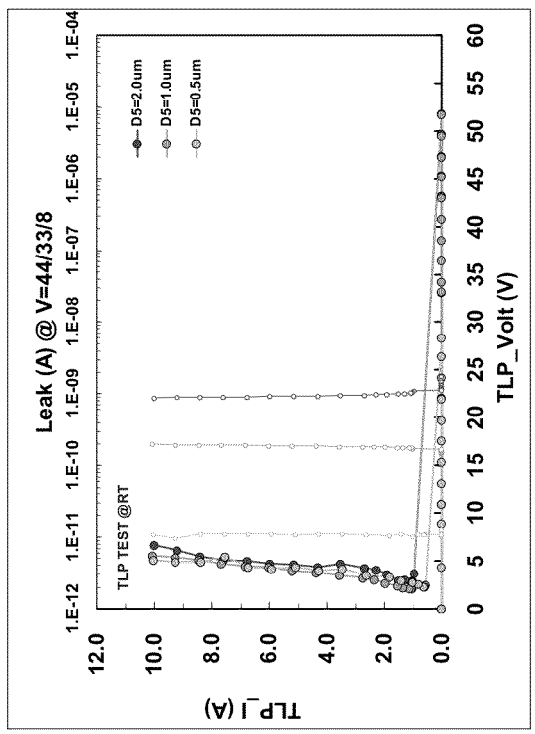
FIG. 7A is a translinear principle ("TLP") curve of a conventional silicon-controlled rectifier.
Figure 7B:
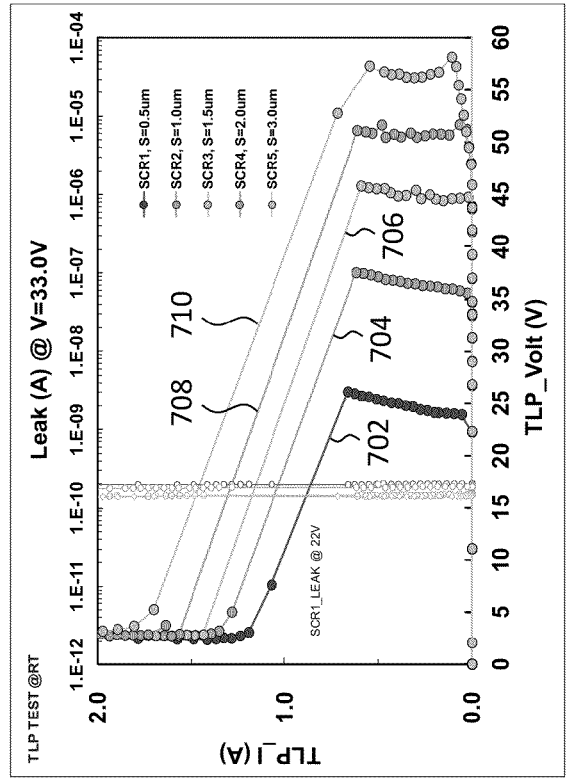
FIG. 7B is a TLP curve of silicon-controlled rectifiers in accordance with some embodiments.

The SCRs 100 advantageously have a high snapback trigger voltages and currents, which prevent them from being falsely triggered. For example, FIG. 7A illustrates the snapback I-V characteristics of a conventional SCR, and FIG. 7B illustrates the snapback I-V characteristics of an improved SCR 100 in accordance with some embodiments. As can be seen by comparing FIGS. 7A and 7B, the SCRs 100 has higher trigger voltage and current than the convention SCR illustrated in FIG. 7A.

Additionally, the SCRs 100 can be fabricated the trigger voltages may be adjusted by adjusting the spacing distance, S. For example, trace 702 in FIG. 7B was simulated for an SCR 100 having a spacing distance, S, of 0.5 µm and has a trigger voltage of approximately 25 volts. Trace 704 corresponds to a spacing distance of 1 µm and has a trigger voltage of approximately 35 volts, trace 706 corresponds to a spacing distance of 1.5 µm and has a trigger voltage of approximately 45 volts, and trace 708 corresponds to a spacing distance of 2 µm and has a breakdown voltage of approximately 50 volts. Trace 710 corresponds to a spacing distance of 3 µm and has a trigger voltage of approximately 55 volts.

The method of fabricating an improved SCR 100 is described with reference to FIG. 8, which is a flow diagram of one example of a method 800 of fabricating an SCR. At block 802, a lightly-doped region is formed over a semiconductor substrate. In some embodiments, such as the embodiments illustrated in FIGS. 1 and 2, lightly-doped region 104 is formed directly over semiconductor substrate 102. In some embodiments, such as the embodiments illustrated in FIGS. 3 and 4, lightly-doped region 104 is formed over NBL 120. As described above, lightly-doped region 104 can be formed by epitaxial growth or by doping the area with a suitable p-type dopant to the desired doping concentration. In some embodiments, lightly doped region 104 has a doping concentration between $1 \times 10^{14}$ cm$^{-3}$ to $1 \times 10^{15}$ cm$^{-3}$.

At block 804, the lightly-doped region is doped with an n-type dopant to form n-well 106 in an upper surface of lightly-doped region 104. In some embodiments, n-well 106 is doped with a suitable n-type material such as, for example, arsenic, phosphorus, antimony, or other Group V element to a concentration between $1 \times 10^{16}$ cm$^{-3}$ to $1 \times 10^{17}$ cm$^{-3}$.

At block 806, a p-well 108 is formed in an upper surface of lightly-doped region 104. P-well 108 is formed in lightly-doped region 104 such that it is laterally spaced from n-well 106 by a spacing distance, S. The spacing distance, S, is selected to set the clamping characteristics of the SCR. For example, increasing the spacing distance, S, results in the SCR having larger trigger and breakdown voltages while decreasing the spacing distance, S, lowers the trigger and breakdown voltages of the SCR. In some embodiments, lightly-doped region 104 is doped with a p-type material such as, for example, boron, gallium, aluminum, or any Group III element to a concentration between $1 \times 10^{14}$ cm$^{-3}$ to $1 \times 10^{15}$ cm$^{-3}$.

At block 808, one or more P+ regions are formed. In some embodiments, a P+ region is formed in an upper surface of n-well 106 and in the upper of p-well 108. As described above, the P+ region 110 is formed in an upper surface of n-well 106 by doping the upper region of n-well 106 with a p-type material such as, for example, boron, gallium, aluminum, or any Group III element to a concentration between $1 \times 10^{20}$ cm$^{-3}$ to $1 \times 10^{22}$ cm$^{-3}$. The P+ region 114 can be formed in the upper surface of p-well 108 at the same time P+ region 110 in the upper surface of n-well 106.

At block 810, one or more N+ regions are formed. In some embodiments, such as the embodiment illustrated in FIGS. 1 and 3, a single N+ region 112 is formed in an upper surface of p-well 108. In embodiments such as the embodiments illustrated in FIGS. 2 and 4, an N+ region 112 is formed in an upper surface of p-well 108 and an N+ region 118 formed in an upper surface of n-well 106. The one or more N+ regions 112, 118 are formed through a doping process using an n-type material such as, for example, arsenic, phosphorus, antimony, or other Group V element until the desired concentration is obtained. In some embodiments, the N+ regions have a concentration between $1 \times 10^{20}$ cm$^{-3}$ to $1 \times 10^{22}$ cm$^{-3}$.

At block 812, the electrical couplings for the anode and cathode of the SCR are formed. In some embodiments, the cathode is formed by coupling the N+ region 112 and P+ region 114 are electrically coupled together in a metallization layer disposed above N+ region 112 and P+ region 114. The metallization layers are electrically coupled to conductive contacts disposed directly on top of doped regions 112, 114.

In some embodiments, such as the embodiments illustrated in FIGS. 1 and 3, the anode is formed by depositing a conductive contact over P+ region 110. The conductive contact is electrically coupled to other devices by metallization layers formed over the conductive contact and doped region 110. In some embodiments, such as the embodiments illustrated in FIGS. 2 and 4, the anode is formed by depositing conductive contacts over doped regions 110 and 118, which are electrically coupled in one or more metallization layers.

The SCRs described above advantageously have higher trigger currents, which enables the SCRs to provide improved protections during electrostatic discharge ESD events. Additionally, the SCRs can be fabricated to select desired trigger and breakdown voltages and currents by adjusting a spacing distance between the n-well and p-well.

In some embodiments, a silicon-controlled rectifier includes a first doped region of a first type disposed over a semiconductor substrate. The first doped region has a first doping concentration. A first well of the first type is disposed in a first upper area of the first doped region of the first type. A first well of a second type is disposed in a second upper area of the first doped region of the first type. The first well of the second type is laterally spaced apart from the first well of the first type by a non-zero distance. A second doped region of the first type is disposed in a first upper area of the first well of the second type. The second doped region of the first type forms an anode of the silicon-controlled rectifier and has a second doping concentration that is greater than the first doping concentration. A first doped region of the second type is disposed in a first upper area of the first well of the first type. The first doped region of the second type forms a cathode of the silicon-controlled rectifier.

In some embodiments, a method includes forming a first doped region of a first type having a first doping concentration over a semiconductor substrate. A first upper area of the first doped region of the first type is doped to form a first well of the first type. A second upper area of the first doped region of the first type is doped to form a first well of a second type. The first well of the second type is laterally spaced from the first well of the first type by a non-zero distance. A first upper area of the first well of the second type is doped to form a second doped region of the first type. The second doped region of the first type forms an anode of the silicon-controlled rectifier and has a second doping concentration that is greater than the first doping concentration. A first upper area of the first well of the first type is doped to form a first doped region of the second type. The first doped region of the second type forms a cathode of the silicon-controlled rectifier.

In some embodiments, a silicon-controlled rectifier includes a first doped region of a first type disposed over a semiconductor substrate. The first doped region has a first doping concentration. A first well of the first type is disposed in a first upper area of the first doped region of the first type. A first well of a second type is disposed in a second upper area of the first doped region of the first type. The first well of the second type is laterally spaced apart from the first well of the first type by a non-zero distance. A second doped region of the first type is disposed in a first upper area of the first well of the second type. The second doped region of the first type forms an anode of the silicon-controlled rectifier and has a second doping concentration that is greater than the first doping concentration. A first doped region of the second type is disposed in a first upper area of the first well of the first type, and a third doped region of the first type is disposed in a second upper area of the first well of the first type. The first doped region of the second type and the third doped region of the first type are electrically coupled together to form a cathode of the silicon-controlled rectifier. A trigger voltage of the silicon-controlled rectifier is based on the non-zero distance.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A silicon-controlled rectifier, comprising:
    a first doped region of a first type disposed over a semiconductor substrate, the first doped region having a first doping concentration;
    a first well of the first type disposed in a first upper area of the first doped region of the first type such that the first well of the first type does not extend to a bottom of the first doped region of the first type;
    a first well of a second type disposed in a second upper area of the first doped region of the first type such that the first well of the second type does not extend to the bottom of the first doped region of the first type, the first well of the second type laterally spaced apart from the first well of the first type by a non-zero distance;
    a second doped region of the first type disposed in a first upper area of the first well of the second type, the second doped region of the first type forming an anode of the silicon-controlled rectifier and having a second doping concentration that is greater than the first doping concentration; and
    a first doped region of the second type disposed in a first upper area of the first well of the first type, the first doped region of the second type forming a cathode of the silicon-controlled rectifier.

2. The silicon-controlled rectifier of claim 1, wherein the first type is a p-type, the second type is an n-type, and the first well of the first type has a doping concentration that is greater the first doping concentration and less than the second doping concentration.

3. The silicon-controlled rectifier of claim 1, wherein the cathode includes a third doped region of the first type disposed in a second upper area of the first well of the first type.

4. The silicon-controlled rectifier of claim 3, wherein the third doped region of the first type is separated from the first doped region of the second type by a shallow trench isolation region formed in the first well of the first type.

5. The silicon-controlled rectifier of claim 3, wherein the first doped region of the second type is separated from the second doped region of the first type by a first shallow trench isolation region.

6. The silicon-controlled rectifier of claim 5, further comprising a buried layer of the second type disposed between and contacting an upper surface of the semiconductor substrate and a lower surface of the first doped region of the first type.

7. The silicon-controlled rectifier of claim 5, wherein the anode includes a second doped region of the second type disposed in a second upper area of the first well of the second type, the second doped region of the second type separated from the second doped region of the first type by a second shallow trench isolation region.

8. The silicon-controlled rectifier of claim 1, further comprising a buried layer of the second type disposed between and contacting an upper surface of the semiconductor substrate and a lower surface of the first doped region of the first type.

9. The silicon-controlled rectifier of claim 1, wherein a trigger voltage of the silicon-controlled rectifier is based on the distance.

10. A method, comprising:
    forming a first doped region of a first type over a semiconductor substrate, the first doped region having a first doping concentration;
    doping a first upper area of the first doped region of the first type to form a first well of the first type such that the first well of the first type does not extend to a bottom of the first doped region of the first type;
    doping a second upper area of the first doped region of the first type to form a first well of a second type such that the first well of the second type does not extend to the bottom of the first doped region of the first type, the first well of the second type laterally spaced from the first well of the first type by a non-zero distance;
    doping a first upper area of the first well of the second type to form a second doped region of the first type, the second doped region of the first type forming an anode of the silicon-controlled rectifier and having a second doping concentration that is greater than the first doping concentration; and
    doping a first upper area of the first well of the first type to form a first doped region of the second type, the first doped region of the second type forming a cathode of the silicon-controlled rectifier.

11. The method of claim 10, wherein forming the first doped region of the first type includes expitaxially growing the first doped region of the first type over the semiconductor substrate.

12. The method of claim 10, wherein forming the first doped region of the first type includes doping the semiconductor substrate with a dopant of the first type.

13. The method of claim 10, further comprising doping a second upper area of the first well of the second type to form a second doped region of the second type.

14. The method of claim 10, further comprising doping a second upper area of the first well of the first type to form a third doped region of the first type.

15. A silicon-controlled rectifier, comprising:
    a first doped region of a first type disposed over a semiconductor substrate, the first doped region having a first doping concentration;
    a first well of the first type disposed in a first upper area of the first doped region of the first type such that the first well of the first type does not extend to a bottom of the first doped region of the first type;
    a first well of a second type disposed in a second upper area of the first doped region of the first type such that the first well of the second type does not extend to the bottom of the first doped region of the first type, the first well of the second type laterally spaced apart from the first well of the first type by a non-zero distance;
    a second doped region of the first type disposed in a first upper area of the first well of the second type, the second doped region of the first type forming an anode of the silicon-controlled rectifier and having a second doping concentration that is greater than the first doping concentration;
    a first doped region of the second type disposed in a first upper area of the first well of the first type; and
    a third doped region of the first type disposed in a second upper area of the first well of the first type,
    wherein the first doped region of the second type and the third doped region of the first type are electrically coupled together to form a cathode of the silicon-controlled rectifier, and a trigger voltage of the silicon-controlled rectifier is based on the non-zero distance.

16. The silicon-controlled rectifier of claim 15, wherein the first type is a p-type, the second type is an n-type, and the first well of the first type has a doping concentration that is greater the first doping concentration and less than the second doping concentration.

17. The silicon-controlled rectifier of claim 15, wherein the third doped region of the first type is separated from the first doped region of the second type by a shallow trench isolation region formed in the first well of the first type.

18. The silicon-controlled rectifier of claim 15, wherein the first doped region of the second type is separated from the second doped region of the first type by a first shallow trench isolation region.

19. The silicon-controlled rectifier of claim 15, further comprising a buried layer of the second type disposed between and contacting an upper surface of the semiconductor substrate and a lower surface of the first doped region of the first type.

20. The silicon-controlled rectifier of claim 15, wherein the anode includes a second doped region of the second type disposed in a second upper area of the first well of the second type.

* * * * *